United States Patent
Grimm

(10) Patent No.: US 8,136,576 B2
(45) Date of Patent: Mar. 20, 2012

(54) VIBRATION ISOLATION SYSTEM FOR SYNTHETIC JET DEVICES

(75) Inventor: Daniel N. Grimm, Round Rock, TX (US)

(73) Assignee: Nuventix, Inc., Austin, TX (US)

( * ) Notice: Subject to any disclaimer, the term of this patent is extended or adjusted under 35 U.S.C. 154(b) by 1245 days.

(21) Appl. No.: 11/821,582

(22) Filed: Jun. 22, 2007

(65) Prior Publication Data

US 2008/0006393 A1   Jan. 10, 2008

Related U.S. Application Data

(60) Provisional application No. 60/816,149, filed on Jun. 22, 2006.

(51) Int. Cl.
*F28F 7/00*       (2006.01)
*H05K 7/20*       (2006.01)

(52) U.S. Cl. .............. 165/69; 165/81; 165/104.34

(58) Field of Classification Search .............. 165/67, 165/69, 80.3, 104.34, 121, 122, 81; 361/695; 248/560, 613, 615
See application file for complete search history.

(56) References Cited

U.S. PATENT DOCUMENTS

| | | | | |
|---|---|---|---|---|
| 2,668,523 A * | 2/1954 | Lamb | ........ | 123/41.49 |
| 4,774,911 A * | 10/1988 | Yamaguchi et al. | ........ | 123/41.49 |
| 4,805,868 A * | 2/1989 | Claude | ........ | 248/603 |
| 6,269,001 B1 * | 7/2001 | Matteson et al. | ........ | 361/695 |
| 6,341,644 B1 * | 1/2002 | Lo et al. | ........ | 165/80.3 |
| 6,860,323 B2 * | 3/2005 | Cheng | ........ | 165/121 |
| 7,359,200 B2 * | 4/2008 | Zhou et al. | ........ | 361/704 |
| 7,545,641 B2 * | 6/2009 | Chen | ........ | 361/695 |
| 2002/0139518 A1 * | 10/2002 | Lee et al. | ........ | 165/121 |

* cited by examiner

*Primary Examiner* — Tho V Duong
(74) *Attorney, Agent, or Firm* — John A. Fortkort; Fortkort & Houston P.C.

(57) ABSTRACT

A thermal management system is provided herein. The system comprises a substrate (141), a synthetic jet ejector (103), and a vibration isolation element (107) adapted to releasably engage said synthetic jet ejector and said substrate.

27 Claims, 17 Drawing Sheets

VIBRATION ISOLATION SYSTEM FOR SYNTHETIC JET DEVICES

CROSS-REFERENCE TO RELATED APPLICATIONS

This application claims priority to U.S. Ser. No. 60/816,149, filed on Jun. 22, 2006, entitled "Vibration Isolation System for Synthetic Jet Devices", and incorporated herein by reference in its entirety.

FIELD OF THE DISCLOSURE

The present disclosure relates generally to synthetic jet ejectors, and more particularly to systems and methods for controlling the level of vibration in synthetic jet ejectors.

BACKGROUND OF THE DISCLOSURE

As the size of semiconductor devices has continued to shrink and circuit densities have increased accordingly, thermal management of these devices has become more challenging. In the past, thermal management in semiconductor devices was often addressed through the use of forced convective air cooling, either alone or in conjunction with various heat sink devices, and was accomplished through the use of fans. However, fan-based cooling systems are undesirable due to the noise attendant to their use. Moreover, the use of fans requires relatively large moving parts, and corresponding high power inputs, in order to achieve the desired level of heat transfer. Furthermore, while fans are adequate for providing global movement of air over electronic devices, they generally provide insufficient localized cooling to provide adequate heat dissipation for the hot spots that typically exist in semiconductor devices and in many types of electronic equipment.

More recently, thermal management systems have been developed which utilize synthetic jet ejectors. These systems are more energy efficient than comparable fan-based systems, and also offer reduced levels of noise and electromagnetic interference. Systems of this type are described in greater detail, for example, in U.S. Pat. No. 6,588,497 (Glezer et al.). The use of synthetic jet ejectors has proven very efficient in providing localized heat dissipation, and hence can be used to address hot spots in semiconductor devices and electronic equipment. Synthetic jet ejectors may be used in conjunction with fan-based systems to provide thermal management systems that afford both global and localized heat dissipation.

Despite their notable advantages, there is a need in the art for further improvements in synthetic jet ejectors. In particular, there is a need in the art for synthetic jet ejectors which have reduced levels of vibration transmitted from the synthetic jet ejector to the structure that it is mounted to. There is further a need for such synthetic jet ejectors which have a low profile and consume a relatively small amount of space, and hence can be utilized in laptop computers, hand-held devices, and other such equipment where space is at a premium. These and other needs may be met by the systems and methodologies disclosed herein.

SUMMARY OF THE DISCLOSURE

In one aspect, a thermal management system is provided herein. The system comprises a substrate, a synthetic jet ejector, and a vibration isolation element adapted to releasably engage said synthetic jet ejector and said substrate.

In another aspect, a thermal management system is provided herein which comprises a substrate, a synthetic jet ejector housing comprising top and bottom portions, and a vibration isolation element adapted to releasably engage each of said top and bottom portions and said substrate.

DETAILED DESCRIPTION

Figure 1:
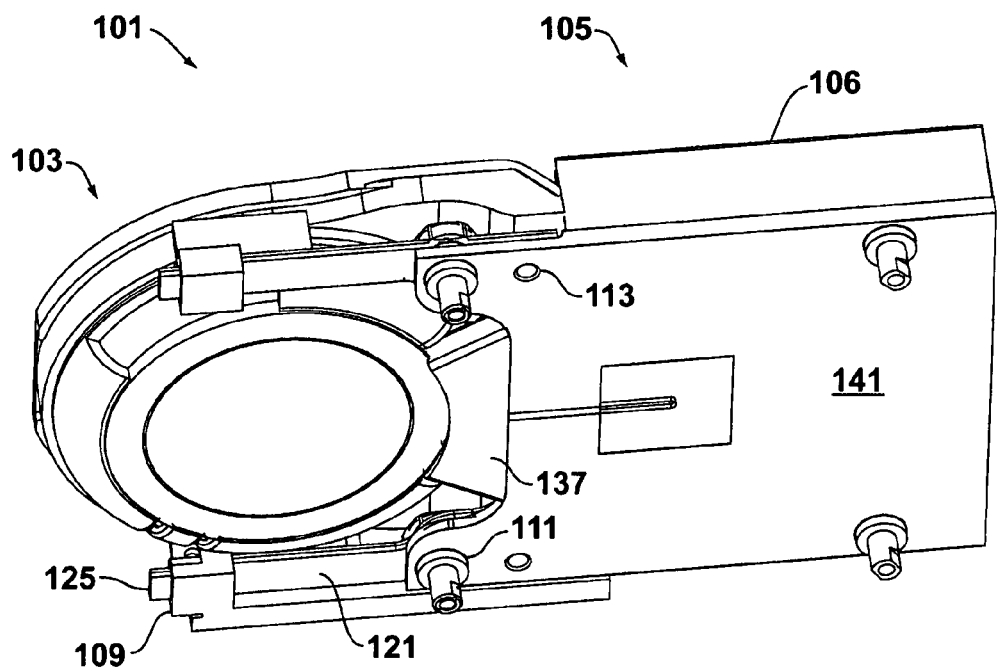
FIG. 1 illustrates a first embodiment of a thermal management system in accordance with the teachings herein.

It has now been found that the aforementioned needs may be met through the provision of a suitably designed vibration isolation system which isolates vibrations in synthetic jet ejectors from substrates to which they are mounted, which does not add significantly to the profile of the synthetic jet ejector, and which can be readily incorporated into a thermal management device.

In some embodiments, this is achieved through the use of a leaf spring which slidingly engages mountings or elements provided on the surfaces of the synthetic jet ejector to provide a secure fit and proper orientation, and which is sufficiently flexible to provide vibration isolation. The leaf spring may be further equipped with twistable tabs or other such devices to readily secure the leaf spring in place, and may also be equipped to interface with elastomeric bushings or other such devices which provide further vibration isolation or device stability.

In other embodiments, vibration isolation is achieved through the provision of an elastomeric vibration isolation element which secures the synthetic jet ejector to a substrate. In such embodiments, the vibration isolation element may comprise a flexible beam having a first pair of protrusions adapted to releasably engage the substrate, and a second pair of protrusions adapted to releasably engage the top and bottom portions of the synthetic jet ejector.

FIGS. 1-9 illustrate a first particular, non-limiting embodiment of a thermal management system 101 in accordance with the teachings herein. The system 101 comprises a combined synthetic jet housing assembly 103 and heat sink 105. The synthetic jet housing assembly 103 is oriented with respect to the heat sink 105 such that it produces synthetic jets which are directed between the fins of the heat sink 105.

A pair of leaf springs 107 (best seen in FIGS. 4 and 8) are provided which are mounted on top of each other. The leaf springs 107 cantilever out from a substrate 141 which supports the heat sink 105, and slidingly engage a set of mountings 109 provided in the synthetic jet housing assembly 103. The leaf springs 107 are attached to the substrate 141 by way of optional fasteners 111, and are further maintained in place with additional fasteners 113. The leaf springs 107 may also be attached to the substrate 141 by way of grommets.

Figure 4:
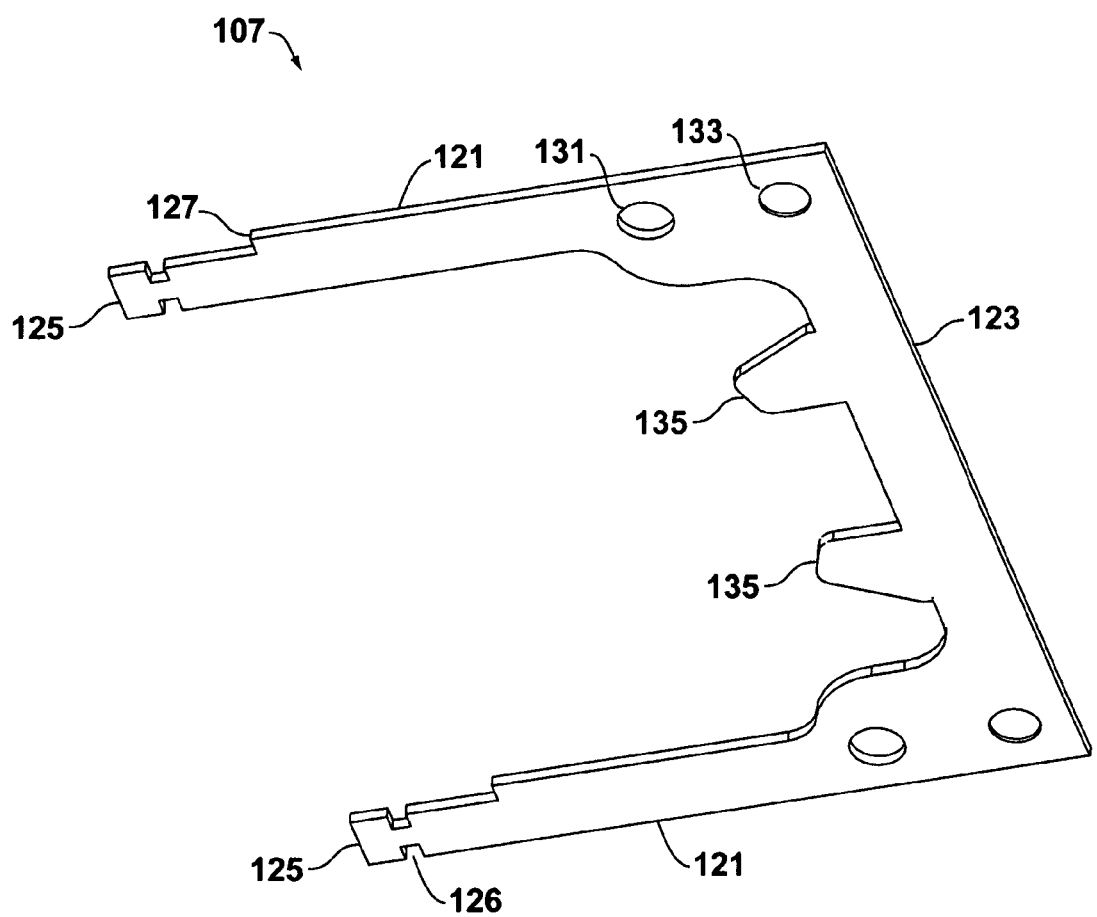
FIG. 4 illustrates a first embodiment of a thermal management system in accordance with the teachings herein.

The leaf spring 107 is shown in greater detail in FIG. 4. As seen therein, the leaf spring 107 comprises a pair of beams 121 which are attached on one end to a base 123, and which terminate on the other end in a twistable tab 125. Each of the beams 121 is equipped with a shoulder 127 which integrates with the features of the host synthetic jet housing assembly 105 to ensure proper positioning therein of the leaf spring 107.

Figure 2:
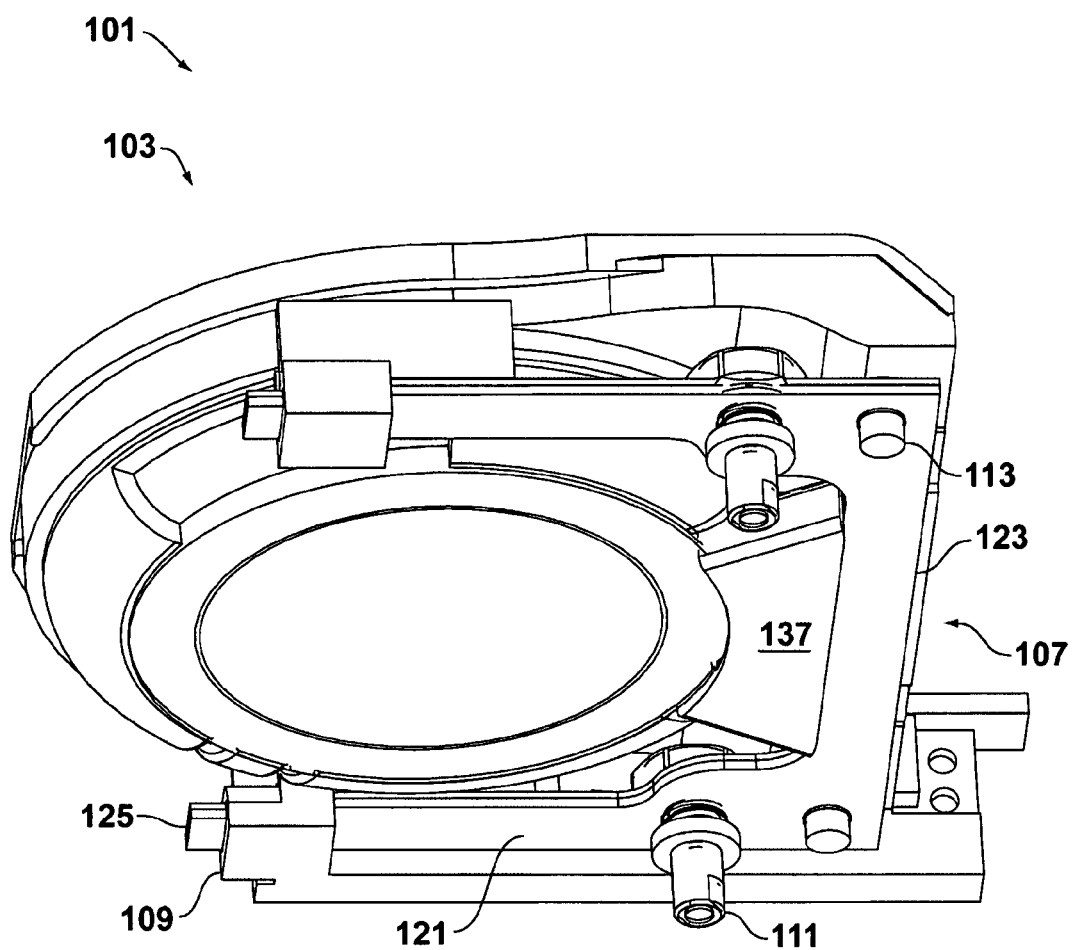
FIG. 2 illustrates a first embodiment of a thermal management system in accordance with the teachings herein.
Figure 3:
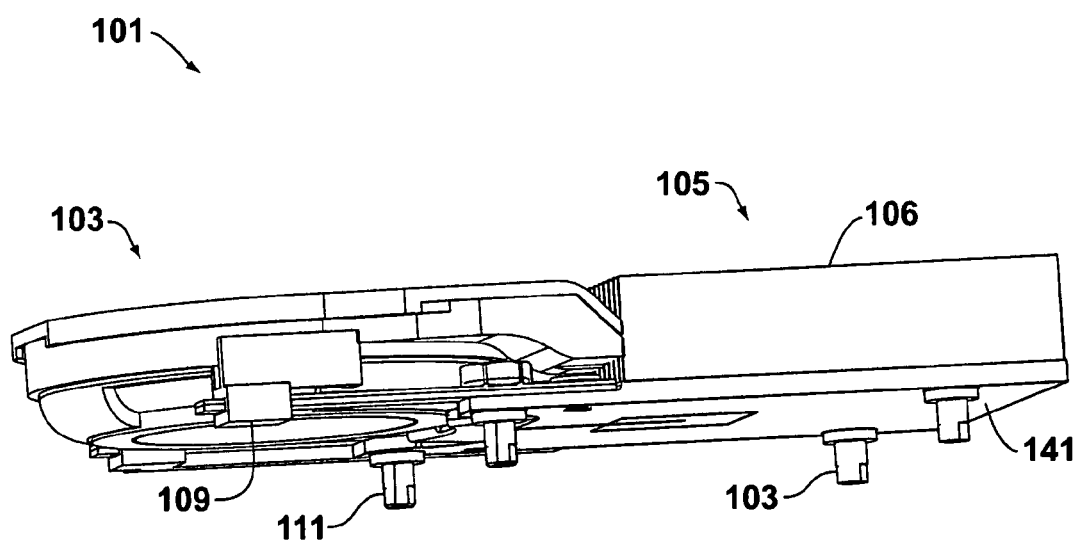
FIG. 3 illustrates a first embodiment of a thermal management system in accordance with the teachings herein.
Figure 8:
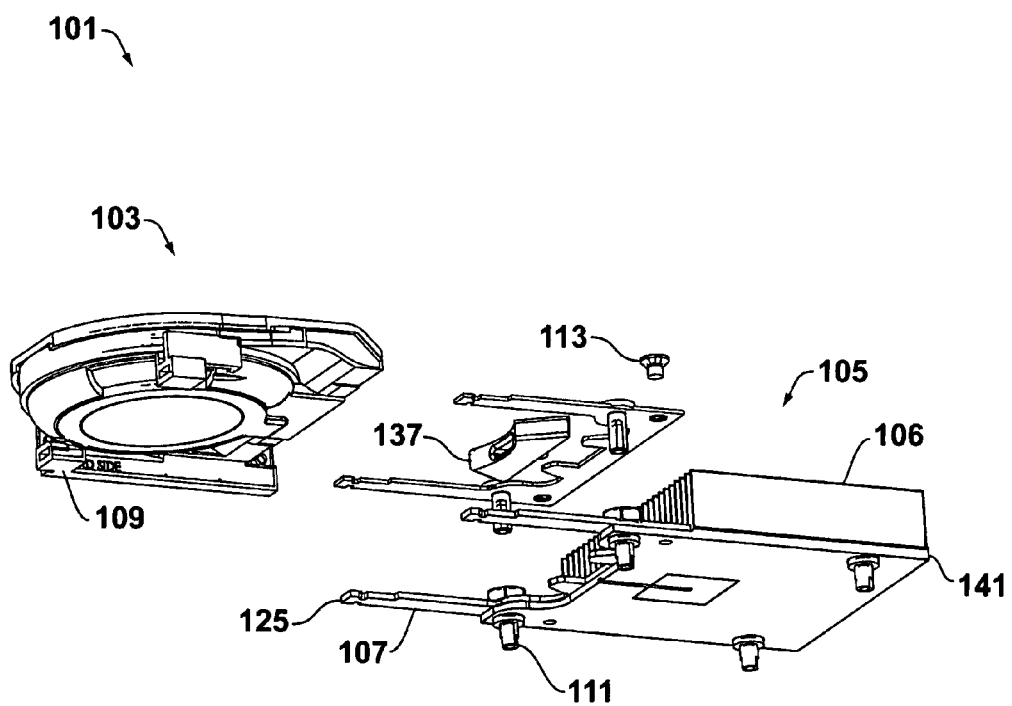
FIG. 8 illustrates a first embodiment of a thermal management system in accordance with the teachings herein.
Figure 9:
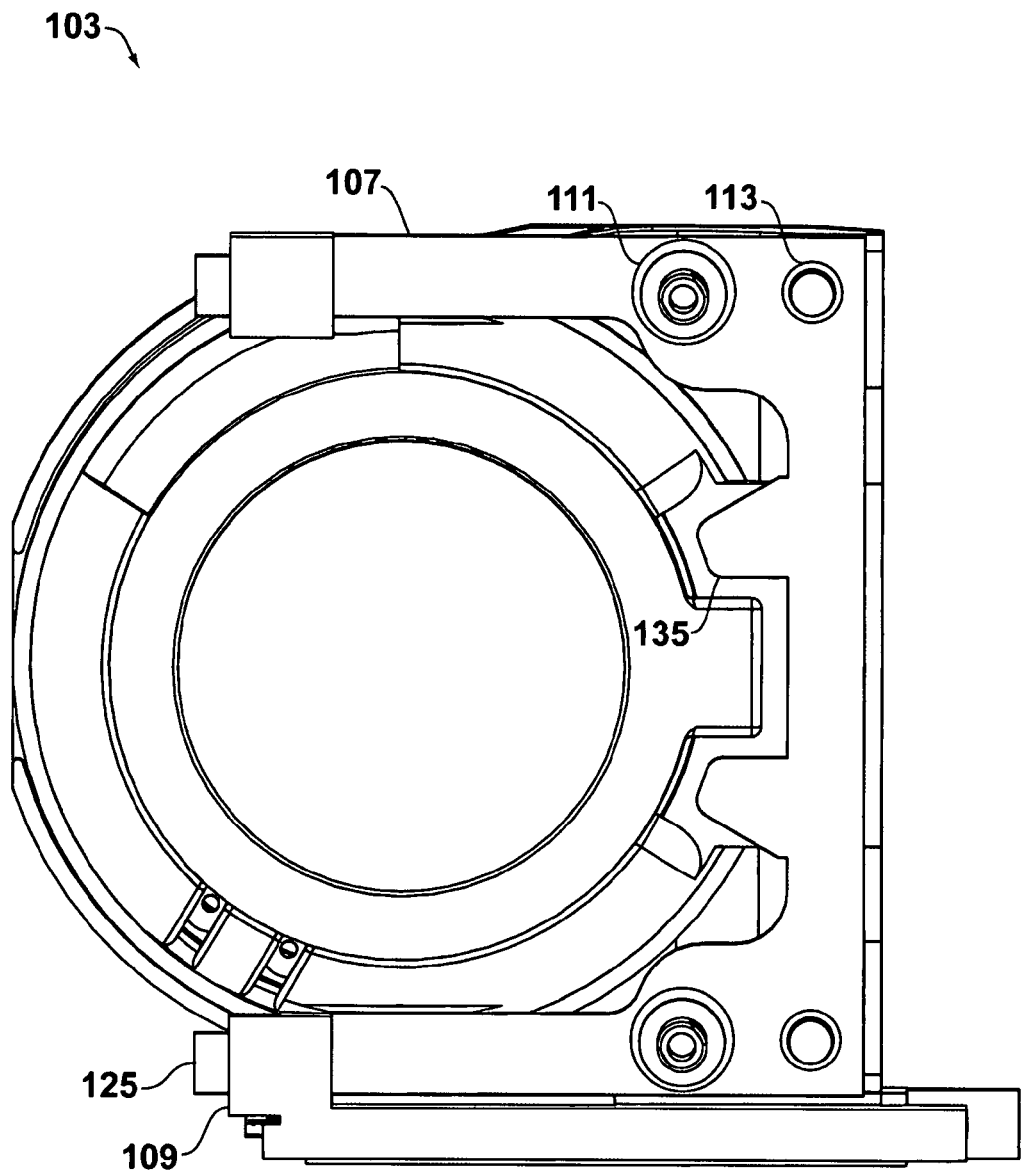
FIG. 9 illustrates a first embodiment of a thermal management system in accordance with the teachings herein.
Figure 10:
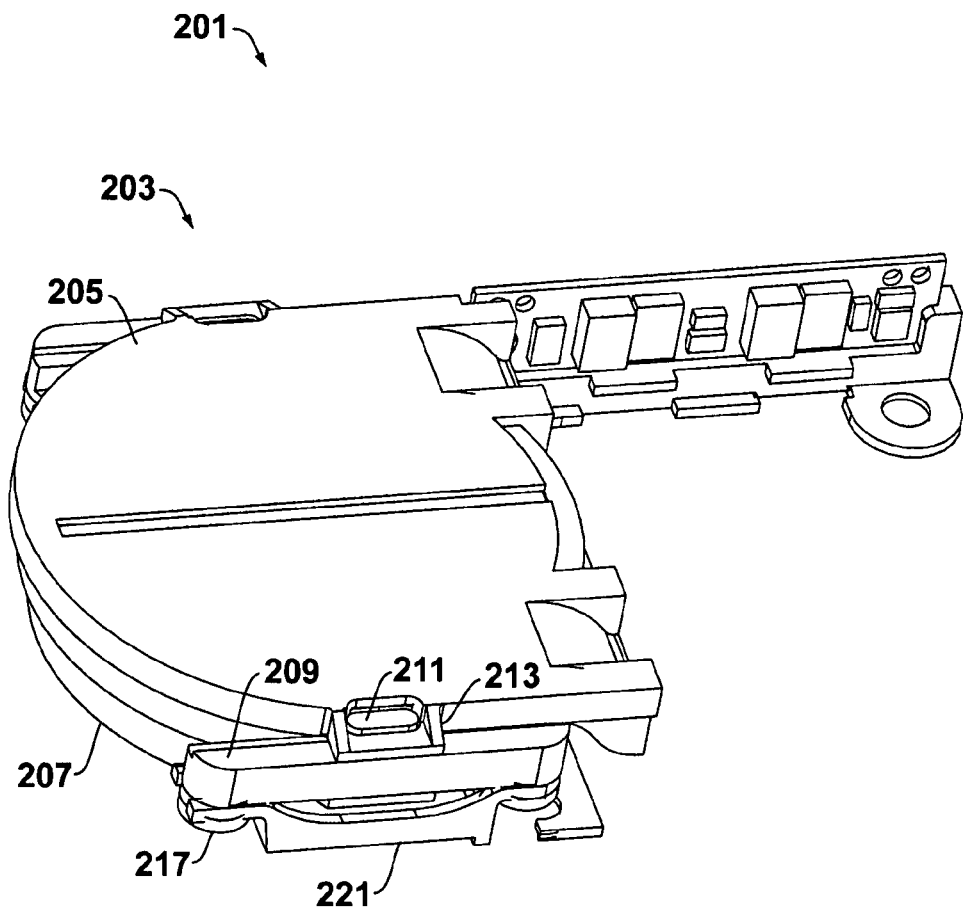
FIG. 10 illustrates a second embodiment of a thermal management system in accordance with the teachings herein.
Figure 11:
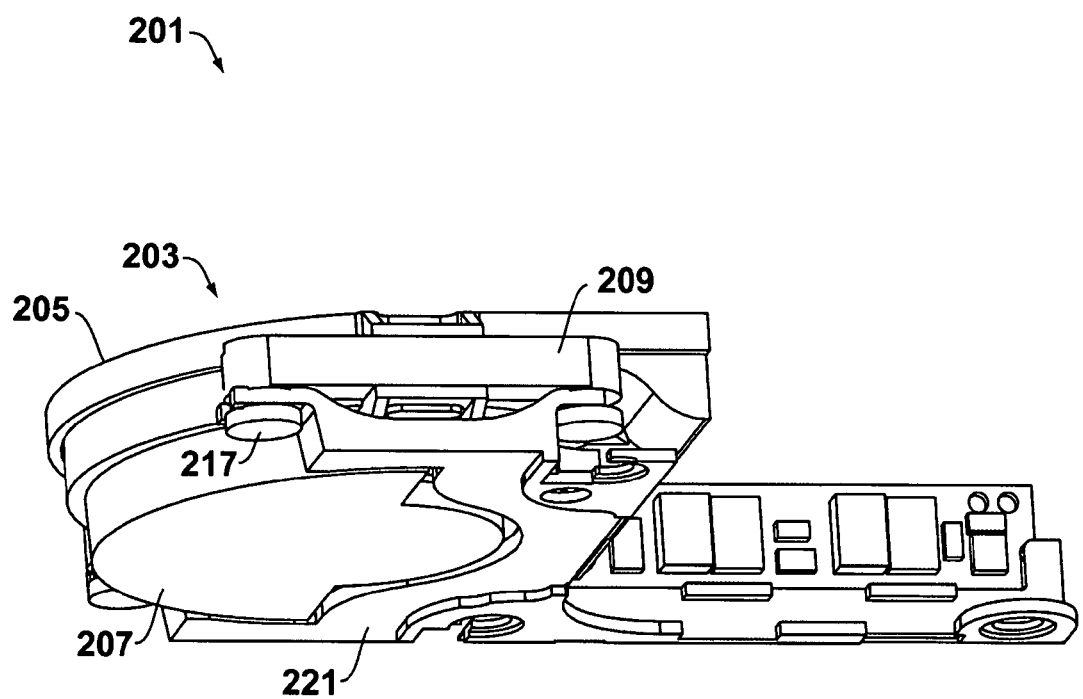
FIG. 11 illustrates a second embodiment of a thermal management system in accordance with the teachings herein.
Figure 12:
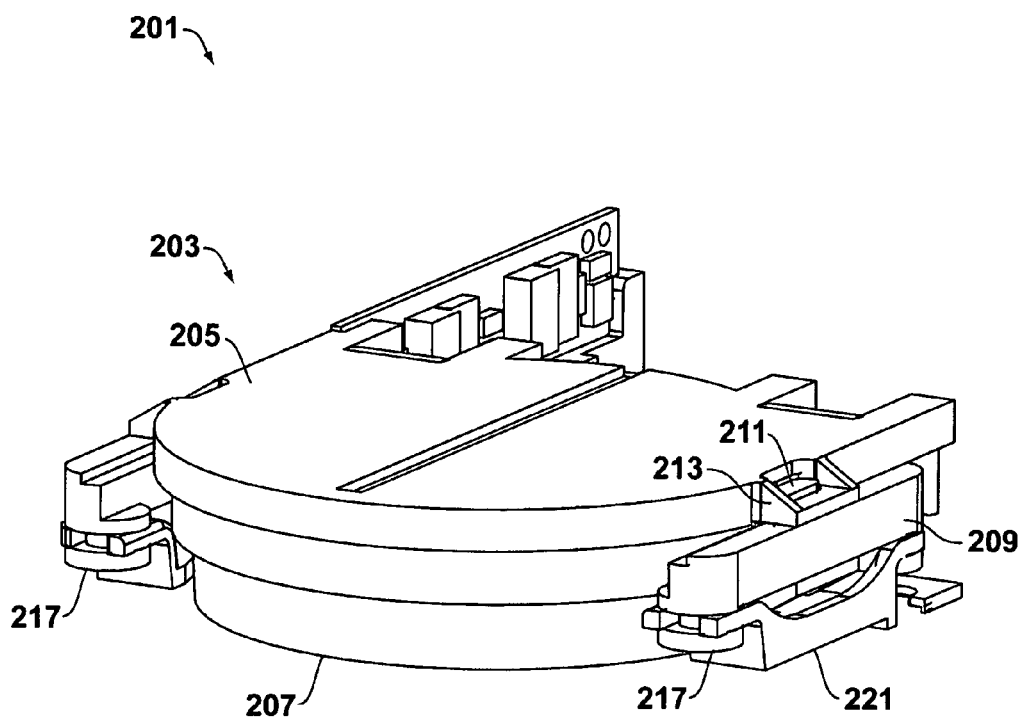
FIG. 12 illustrates a second embodiment of a thermal management system in accordance with the teachings herein.
Figure 13:
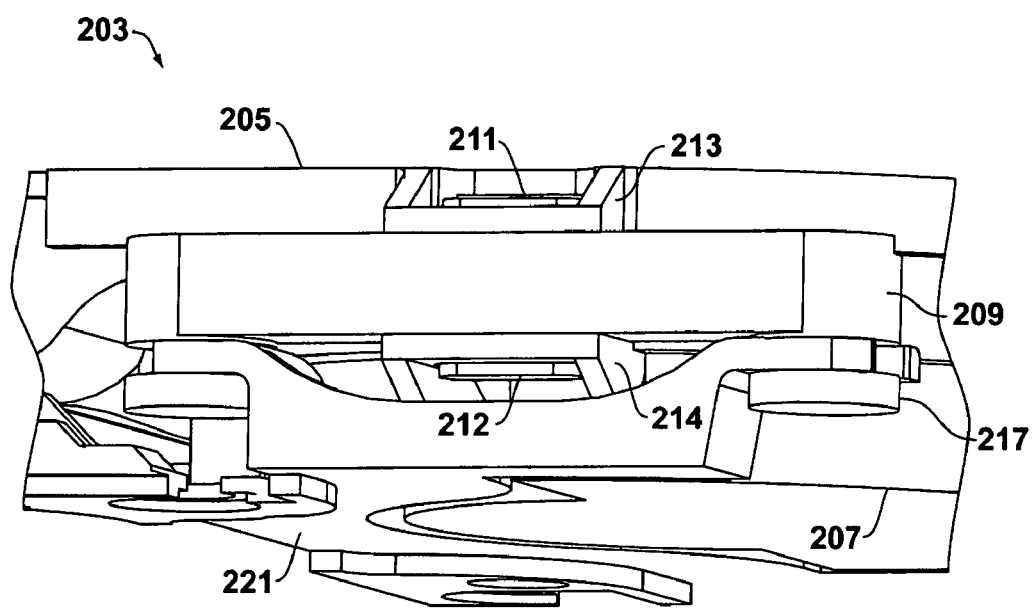
FIG. 13 illustrates a second embodiment of a thermal management system in accordance with the teachings herein.
Figure 14:
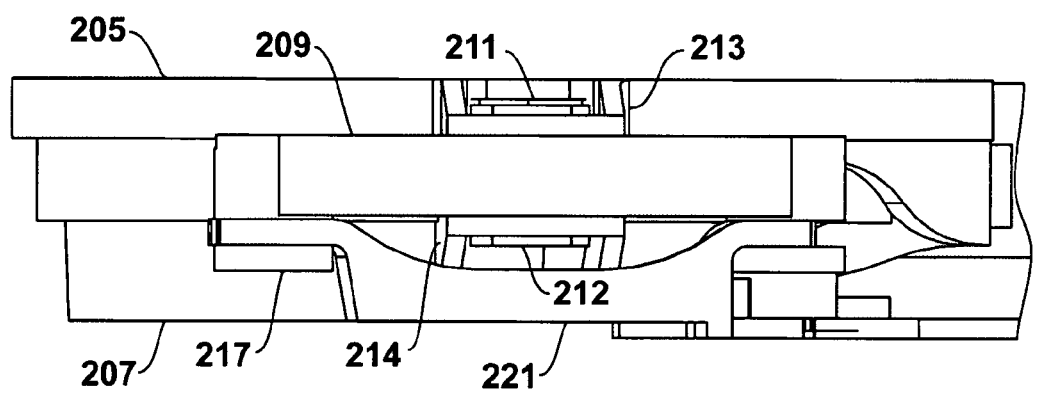
FIG. 14 illustrates a second embodiment of a thermal management system in accordance with the teachings herein.

The base 123 of the leaf spring 107 is provided with first 131 and second 133 sets of apertures to accommodate, respectively, the fasteners 111 and 113 (see FIGS. 1-2). The base 123 is further equipped with a pair of protrusions 135. As best seen in FIG. 8, these protrusions 135 interface with an elastomeric bushing 137 (see FIG. 2) provided on the bottom of the synthetic jet housing assembly 105. The elastomeric bushing 137 serves to provide stabilization for the leaf spring 107 as well as additional vibration isolation or dampening.

The beams 121 of the leaf spring 107 are adapted to flex so as to reduce the transmission of vibrations from the synthetic jet housing assembly to the host device and heat sink 105. They may be designed to flex by bending, torsion, or a combination of both. Preferably, the leaf spring 107 comprises stainless steel or spring steel, but may also comprise plastic or other suitable materials. As previously noted, further vibration isolation is provided by the elastomeric bushing 137 (see FIG. 2).

Figure 5:
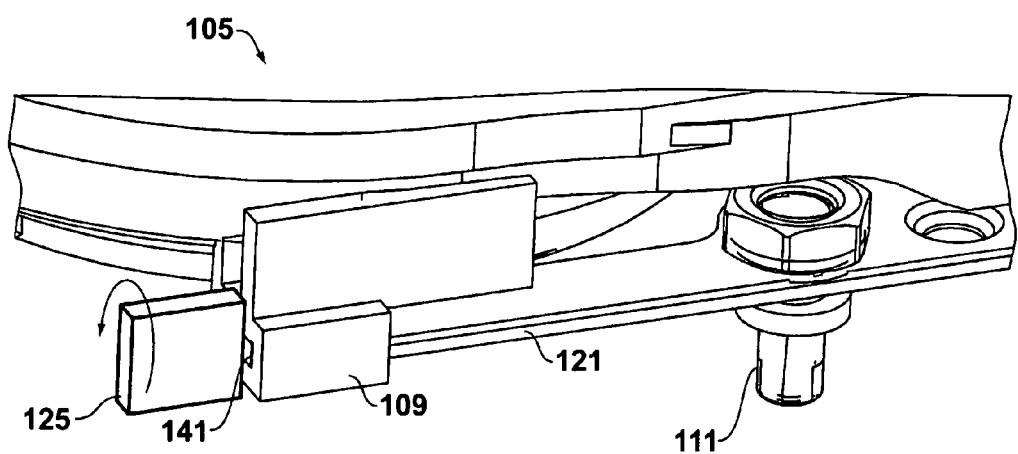
FIG. 5 illustrates a first embodiment of a thermal management system in accordance with the teachings herein.
Figure 6:
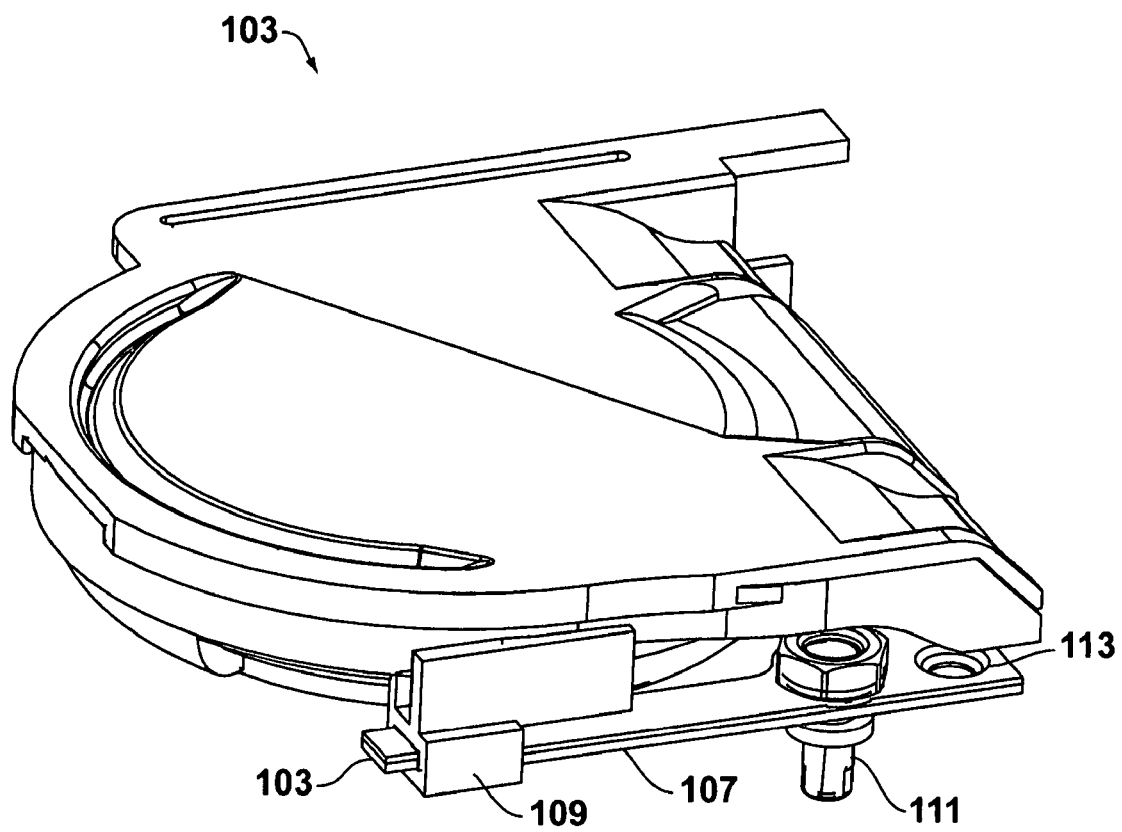
FIG. 6 illustrates a first embodiment of a thermal management system in accordance with the teachings herein.
Figure 7:
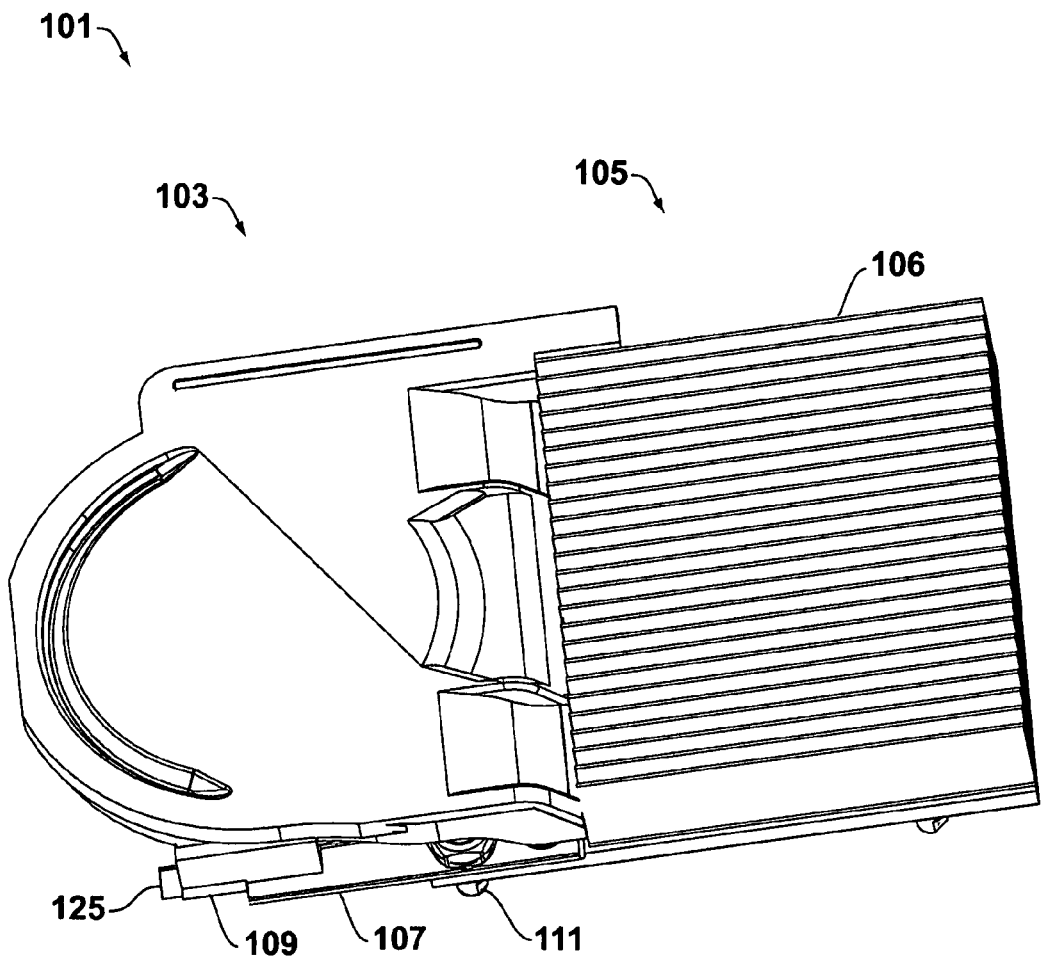
FIG. 7 illustrates a first embodiment of a thermal management system in accordance with the teachings herein.

FIG. 5 illustrates in greater detail the means by which the leaf spring 107 is secured to the synthetic jet housing assembly 103. As previously noted, each of the beams 121 of the leaf spring 107 terminates in a twistable tab 125. Initially (see FIG. 4), these tabs 125 are merely coplanar extensions of the beams 121, and are separated therefrom by a neck 126. As such, the tabs 125 are insertable through slots 141 (see FIG. 5) provided in mountings 109 disposed on the bottom of the synthetic jet housing assembly 103.

After the tabs 125 are inserted through the slots 141, they are twisted out of the major plane of the beams 121, thereby locking the leaf spring 107 in place. The mounting 109 is preferably made out of a sufficiently pliable material so that it deforms slightly against the tab 125 and against the shoulder 127 (see FIG. 4) of the leaf spring 107. This has the effect of securing the synthetic jet housing assembly 105 tightly in place, thereby ensuring rattle-free operation.

It will be appreciated from the foregoing that the material of the tabs 125 and/or the dimensions of the neck 126 are preferably selected such that the tab 125 may be twisted into a locked position through the application of normal hand pressure, and may be unlocked in a similar manner. In variations of this embodiment, the tab may be replaced with various types of threaded or non-threaded fasteners. Thus, for example, in some embodiments, one or more screws or bolts or protrusions may be used in place of the tabs.

FIGS. 10-15 illustrate another particular, non-limiting embodiment of a thermal management system 201 in accordance with the teachings herein. The system 201 depicted therein comprises a synthetic jet ejector 203 which is equipped with upper 205 and lower 207 housing halves. An elastomeric vibration isolation element 209 is provided on each side of the synthetic jet ejector 203.

Figure 15:
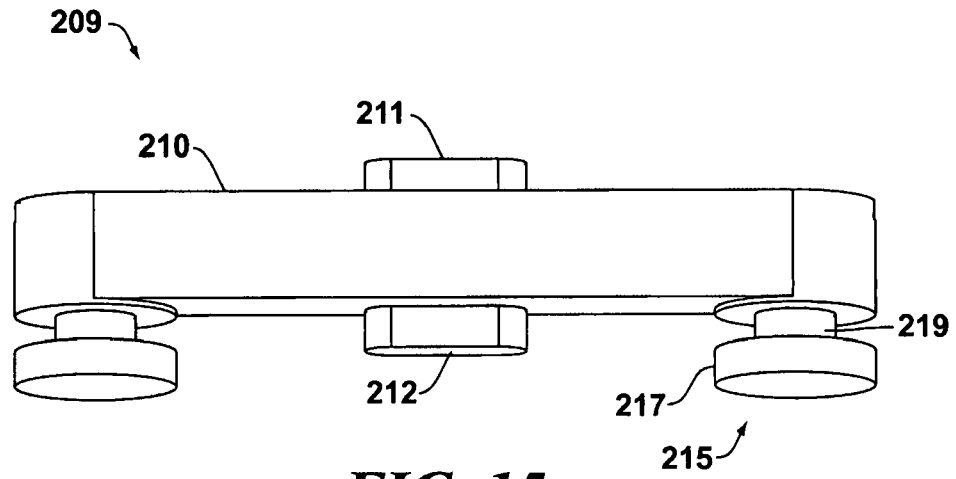
FIG. 15 illustrates the vibration isolation element of the thermal management system of FIG. 10.
Figure 16:
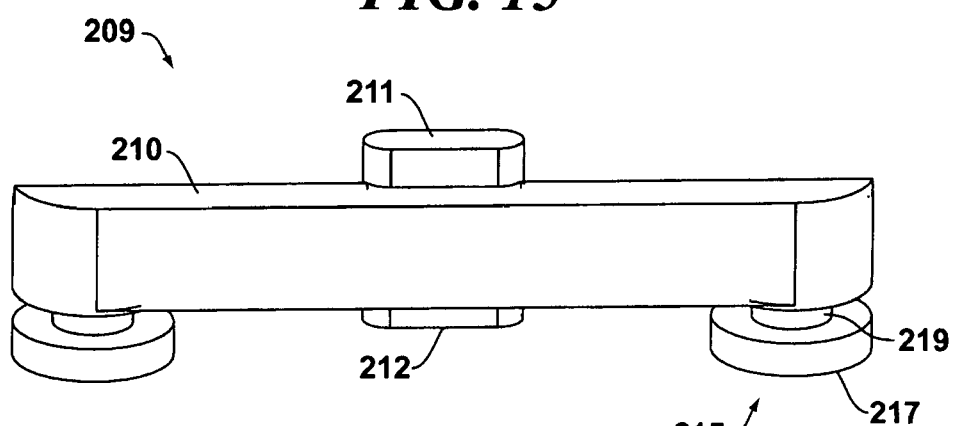
FIG. 16 illustrates the vibration isolation element of the thermal management system of FIG. 10.
Figure 17:
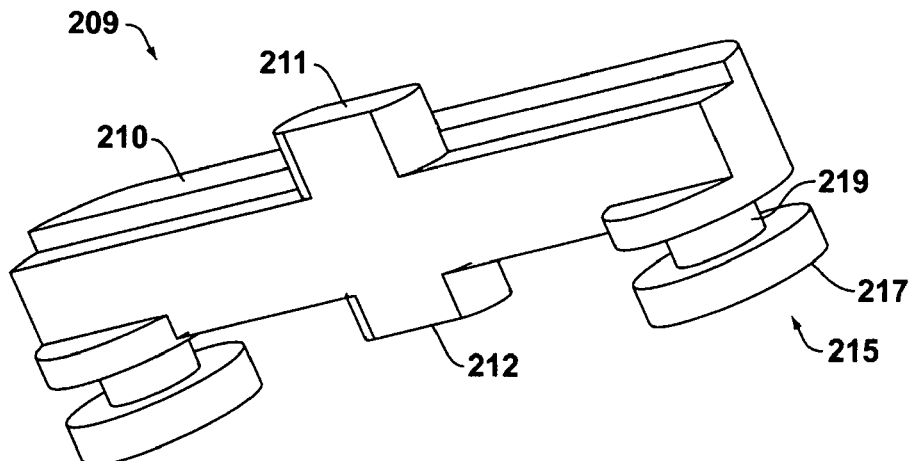
FIG. 17 illustrates the vibration isolation element of the thermal management system of FIG. 10.

As seen in FIGS. 15-17, each of the vibration isolation elements 209 comprises a beam 210 and is equipped with an upper tab 211 and a lower tab 212. The upper tab 211 engages a mounting 213 which is equipped with a complimentary shaped slot and which is provided on a side of the upper housing half 205. Similarly, the lower tab 212 engages a mounting 213 which is equipped with a complimentary shaped slot and which is provided on a side of the lower housing half 207. Each of the vibration isolation elements 209 are further equipped with a pair of base capture features 215 comprising a cylindrical portion 217 attached to the beam 210 by way of a neck 219.

Figure 18:
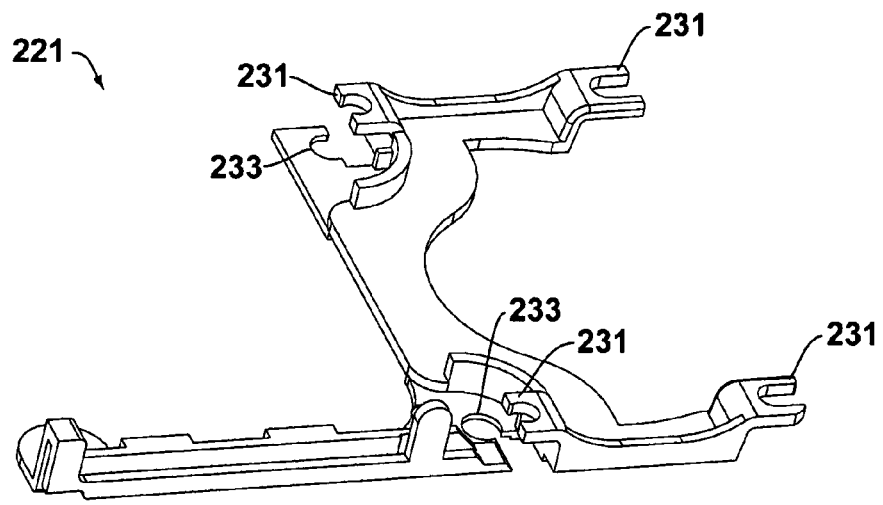
FIG. 18 illustrates the support frame of the thermal management system of FIG. 10.
Figure 19:
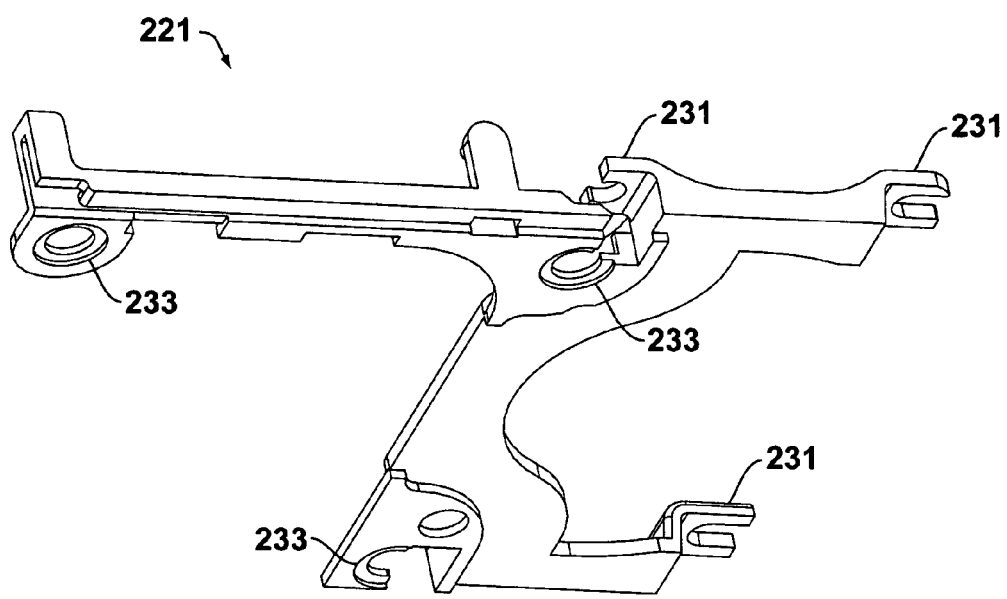
FIG. 19 illustrates the support frame of the thermal management system of FIG. 10.
Figure 20:
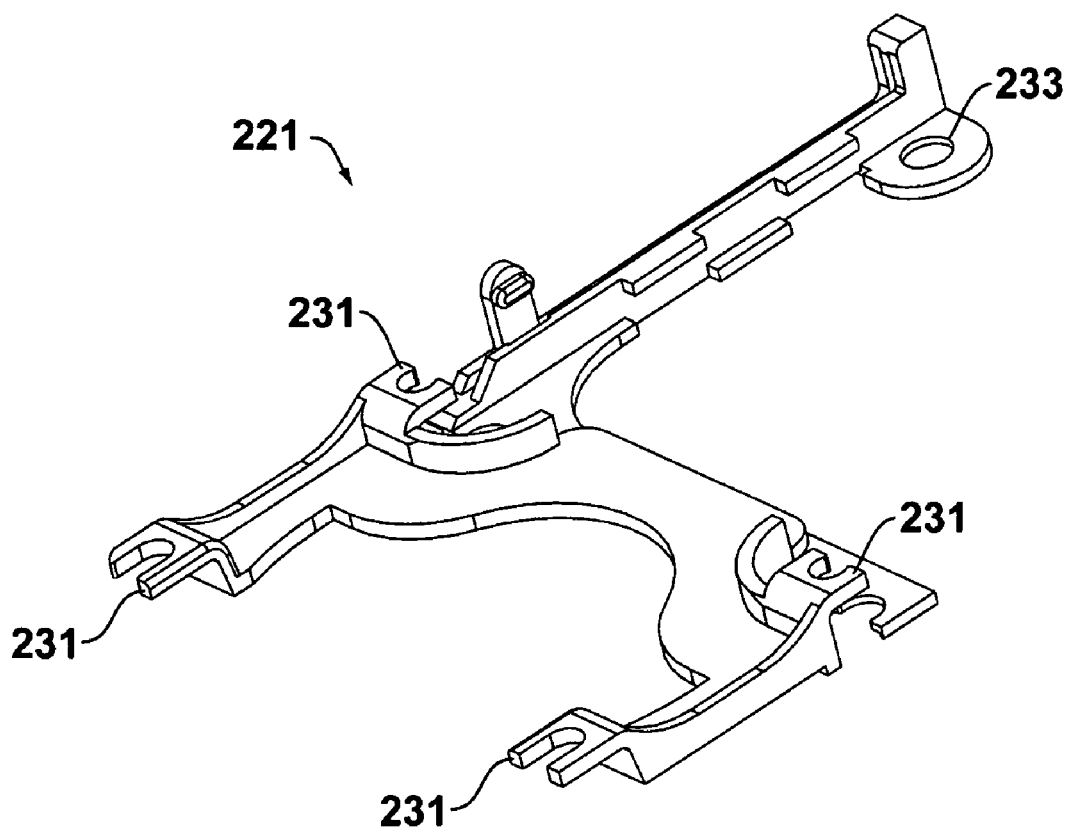
FIG. 20 illustrates the support frame of the thermal management system of FIG. 10.

As best seen in FIGS. 18-20, the thermal management system 201 is provided with a support frame 221 which supports the synthetic jet ejector 203 and which is equipped with a plurality of forked slots 231. The forked slots 231 engage the cylindrical portions 217 of the base capture features 215. The support frame 221 is also equipped with a plurality of apertures through which the thermal management system 201 may be secured to a substrate through the use of suitable fasteners. In various possible embodiments in accordance with the teachings herein, the support frame 221 may also contain various other features which facilitate mounting of the synthetic jet ejector to a substrate, which impart structural integrity to the thermal management system 201, and/or which ensure proper orientation or alignment with an adjacent heat sink. The support frame 221 may also be implemented as a component of the heat sink.

In use, the beams 210 of the vibration isolation elements 209 flex to reduce transmission of vibrations from the synthetic jet ejector 203 to the substrate upon which the synthetic jet ejector 203 is mounted. The vibration isolation elements 209 are especially advantageous in that they may be readily and economically molded from a variety of elastomers and plastics using molding techniques that are well known in the art.

It will be appreciated that the vibration isolation elements 209 and the capture features 215 thereof may have a variety of geometries and dimensions. Thus, for example, in some variations, the capture features 215 may comprise one or more elastomeric protrusions that releasably engage one or more apertures defined in the synthetic jet ejector housing and/or the substrate. The capture features may also include various other releasable fasteners as are known to the art, including, for example, hook and loop type fasteners.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A thermal management system, comprising:
    a substrate;
    a synthetic jet ejector; and
    a vibration isolation element adapted to releasably engage said synthetic jet ejector and said substrate;
wherein said vibration isolation element comprises a flexible beam having a first pair of protrusions adapted to releasably engage said substrate, and a second pair of protrusions adapted to releasably engage said synthetic jet ejector.

2. The thermal management system of claim 1, wherein said synthetic jet ejector is equipped with at least one slot, and wherein vibration isolation element is equipped with at least one member that releasably engages said slot.

3. The thermal management system of claim 1, wherein said vibration isolation element comprises a base having first and second protrusions extending therefrom, and wherein said first and second protrusions engage first and second slots, respectively, which are provided in said synthetic jet ejector.

4. The thermal management system of claim 3, wherein said base is attached to said substrate by way of at least one fastener.

5. The thermal management system of claim 3, wherein said base is attached to said substrate by way of at least one grommet.

6. The thermal management system of claim 5, wherein said at least one grommet comprises a head which is in contact with said base.

7. The thermal management system of claim 1, wherein said substrate comprises a heat sink.

8. The thermal management system of claim 7, wherein said heat sink comprises a base having a plurality of fins attached thereto.

9. The thermal management system of claim 8, wherein said vibration isolation element is adapted to orient said synthetic jet ejector with respect to said heat sink such that the synthetic jet ejector produces a synthetic jet whose longitudinal axis is directed between said plurality of fins.

10. The thermal management system of claim 1, wherein said substrate is equipped with first and second forked elements which releasably engage said second pair of protrusions.

11. The thermal management system of claim 10, wherein each of said second pair of protrusions comprises a cylindrical element connected to said beam by way of a neck.

12. The thermal management system of claim 11, wherein said neck is cylindrical and has a smaller diameter than said cylindrical element.

13. The thermal management system of claim 1, wherein said synthetic jet ejector comprises an upper portion and a lower portion, wherein said second pair of protrusions comprises a first protrusion adapted to releasably engage a first aperture disposed in said upper portion, and wherein said second pair of protrusions further comprises a second protrusion adapted to releasably engage a second aperture disposed in said lower portion.

14. The thermal management system of claim 13, wherein each of said protrusions in said second pair of protrusions has an essentially elliptical cross-section.

15. The thermal management system of claim 1, wherein said synthetic jet ejector comprises an upper portion and a lower portion, and wherein said beam is equipped with first and second longitudinal grooves which are adapted to mate with said upper and said lower portions, respectively.

16. The thermal management system of claim 15, wherein said flexible beam contains a flat face which abuts each of said first and second longitudinal grooves.

17. A thermal management system, comprising:
    a substrate;
    a synthetic jet ejector housing comprising top and bottom portions; and
    a vibration isolation element adapted to releasably engage each of said top and bottom portions and said substrate;
wherein each of said top and bottom portions contains a tab having a slot therein, and wherein said vibration isolation element is equipped with a first set of protrusions adapted to releasably engage the slot in the tabs of each of said top and bottom portions.

18. The thermal management system of claim 17, wherein each of the members of said first set of protrusions are complimentary in shape to the slot in the tabs of each of said top and bottom portions.

19. The thermal management system of claim 18, wherein said vibration isolation element further comprises a longitudinal beam, and wherein said first set of protrusions are mounted on said beam.

20. The thermal management system of claim 19, wherein the first set of protrusions comprises first and second members which are mounted on opposing sides of said beam.

21. The thermal management system of claim 17, wherein said vibration isolation element is further equipped with a second set of protrusions, and wherein said substrate is equipped with first and second forked elements which releasably engage said second set of protrusions.

22. The thermal management system of claim 21, wherein each of said first set of protrusions comprises a cylindrical element connected to said beam by way of a neck.

23. The thermal management system of claim 22, wherein said neck is cylindrical and has a smaller diameter than said cylindrical element.

24. The thermal management system of claim 19, wherein said synthetic jet ejector comprises an upper portion and a lower portion, and wherein said beam is equipped with first and second longitudinal grooves adapted to mate with said upper and said lower portions, respectively.

25. The thermal management system of claim 24, wherein said beam contains a flat face which abuts each of said first and second longitudinal grooves.

26. The thermal management system of claim 1, wherein said synthetic jet ejector comprises (a) a housing having an orifice defined therein, and (b) a diaphragm in fluidic communication with said orifice.

27. The thermal management system of claim 17, wherein said synthetic jet ejector comprises (a) a housing having an orifice defined therein, and (b) a diaphragm in fluidic communication with said orifice.

* * * * *